Figure 2:
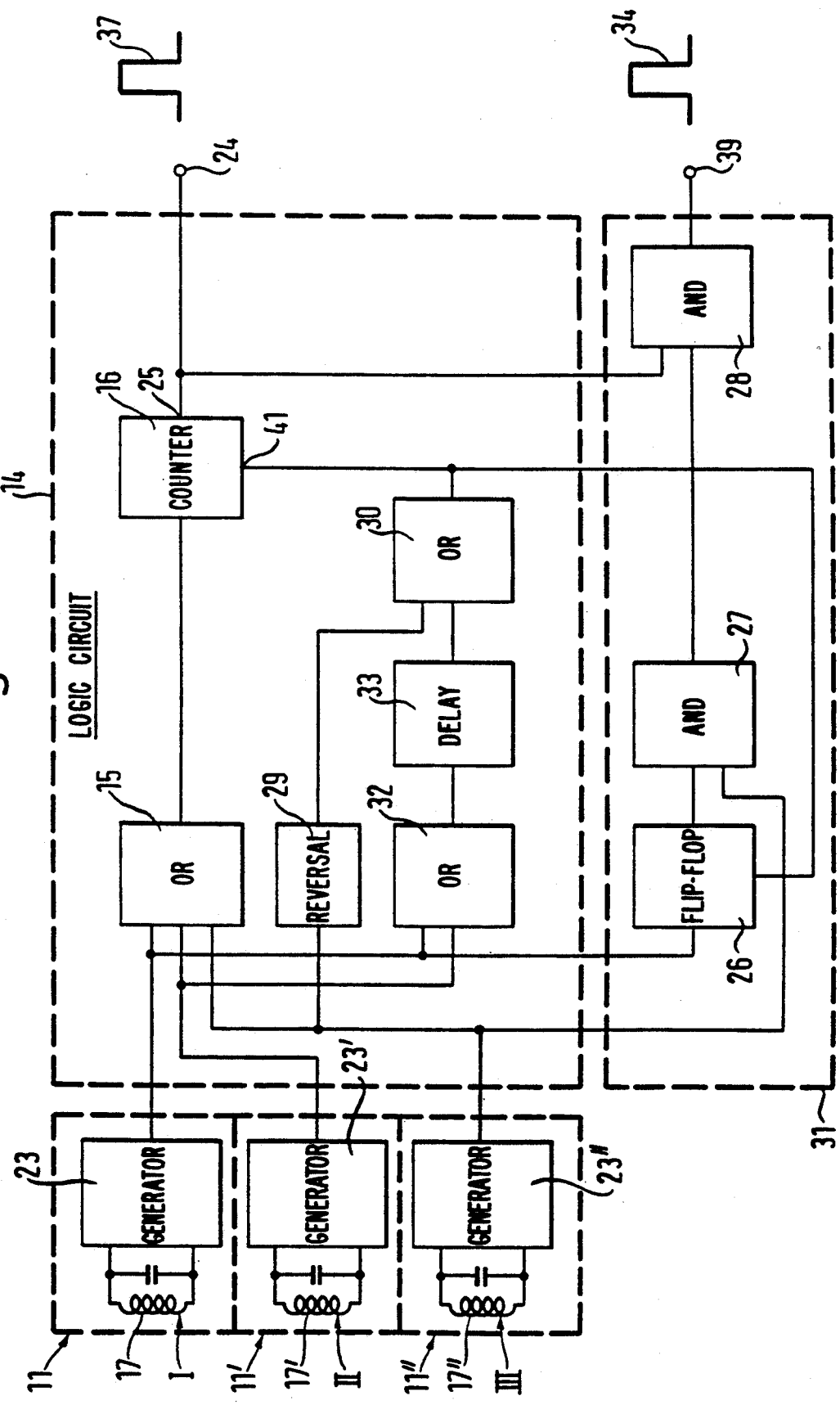

United States Patent

Mueller-Stuercken

[11] Patent Number: 5,187,723
[45] Date of Patent: Feb. 16, 1993

[54] APPARATUS FOR DETECTING METAL PARTS WHICH ARE MOVABLE RELATIVE TO A METAL SENSITIVE SENSOR ARRANGEMENT

[76] Inventor: Harro Mueller-Stuercken, Am Weisgraben 4, Burghaun, Fed. Rep. of Germany, 6419

[21] Appl. No.: 707,887

[22] Filed: May 31, 1991

[30] Foreign Application Priority Data

Jun. 1, 1990 [DE] Fed. Rep. of Germany ....... 4017780

[51] Int. Cl.⁵ .............................................. G06M 3/02
[52] U.S. Cl. ........................................... 377/6; 377/33; 340/674; 324/243; 324/327; 331/65
[58] Field of Search ................. 377/6, 9, 33; 340/674, 340/944; 331/65; 324/232, 243, 236, 325, 326, 327, 225

[56] References Cited
U.S. PATENT DOCUMENTS 2,893,633  7/1959  Van Haagan ........................ 377/6
3,618,819 11/1971  Blackburn et al. ................... 377/6
3,943,339  3/1976  Koerner et al. ..................... 377/9
4,768,209  8/1988  Yu ...................................... 377/6
4,866,377  9/1989  Macovschi ......................... 331/65
4,982,412  1/1991  Gross ................................. 377/6
5,033,065  7/1991  Keromnes .......................... 377/6

Primary Examiner—John S. Heyman
Attorney, Agent, or Firm—Townsend and Townsend

[57] ABSTRACT

An apparatus for the detecting of metal parts (12) which move relative to a metal sensitive sensor arrangement has at least two part sensors which transmit an electrical pulse to an electronic evaluation circuit for a particular approach by a metal part (12). Several part sensors are connected spatially in series with one another so that a specific metal part (12) causes the part sensors to respond in sequence. The electronic evaluation circuit (13) then transmits a signal when and only when it detects the pulse sequence which arises through sequential response of the part sensors.

5 Claims, 3 Drawing Sheets

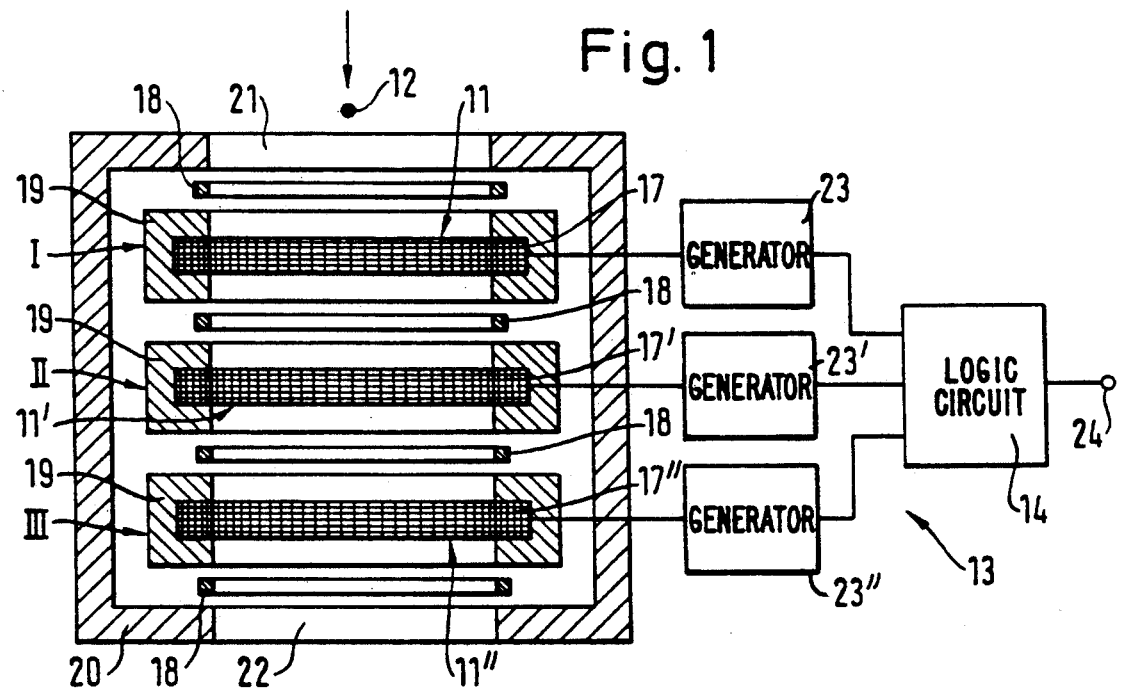
Fig. 1
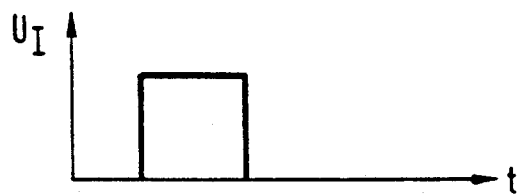
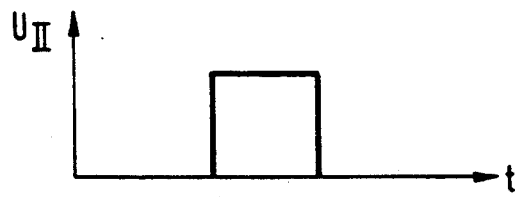
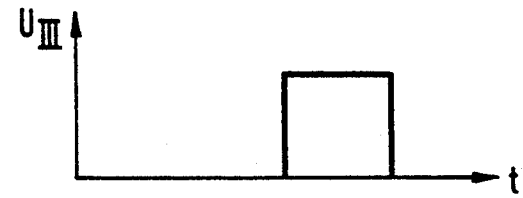
Fig. 4
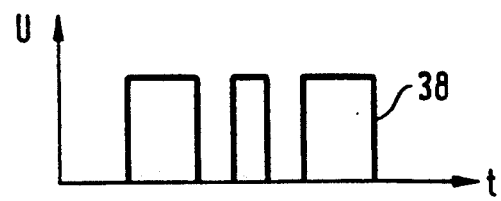

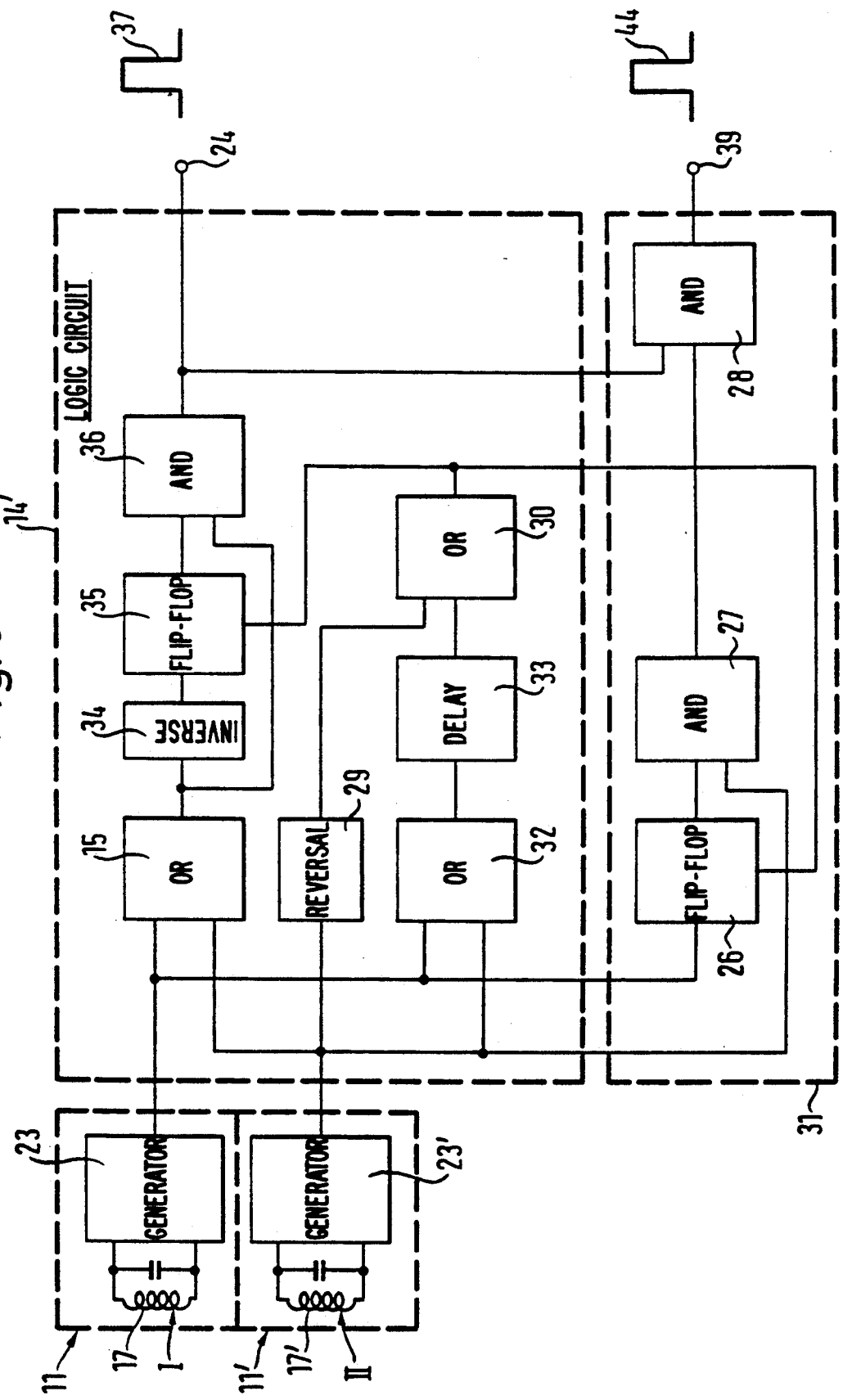

APPARATUS FOR DETECTING METAL PARTS WHICH ARE MOVABLE RELATIVE TO A METAL SENSITIVE SENSOR ARRANGEMENT

DESCRIPTION

The invention relates to an apparatus for the detection and counting of metal parts movable relative to a metal sensitive sensor, with the sensor transmitting an electrical pulse to an electronic sensing circuit at a predetermined approach by a metal part, in particular as a metal part moves past it. An apparatus of this kind is known from DE-PS 29 44 192.

In the production of all possible industrial products sensor arrangements are required which can recognize moved metallic parts. Thus, in the field of stamping, pressing and punching technology a check must be made after each stroke to see whether the punched, stamped or pressed part has actually left the tool station before a new stroke is initiated. Only in this way is it possible to avoid tool breakage.

As a further example metal separation from pourable bulk goods, such as granular plastic, should be mentioned, which in particular arises with recycling materials. Metal fragments which enter into the extruder can cause serious damage and indeed in particular to the conveying screw and the injecting nozzle.

It is also important to check chemical and pharmaceutical products, for example tablets or capsules, for possible metallic inclusion which can arise from the wear of the tool during manufacture.

When checking hydraulic systems metallic parts can also be contained in the hydraulic fluid due to wear and it is important to recognize this at an early stage before greater damage occurs to the machine.

Since all the indicated tasks place increasingly higher requirements on the sensitivity of the metal detectors it was necessary to greatly increase this response sensitivity. By the use of the method set forth in DE-OS 21 57 824 it is possible to obtain the required sensitivity by means of the use of critically coupled oscillators and low noise amplifiers in conjunction with oscillating circuits with a high quality factor. However, in practical use problems again arise since disturbing influences can likewise cause the electronic circuit of the sensor to respond. Such disturbing influences can, for example, take the form of mechanical jolts, such as arise on the closing of a punching or press tool, or during the ejection checking, or on switching over of a sorting branch in a metal separation device, or on the occurence of pressure peaks when monitoring hydraulic systems. In other words the possible high sensitivity can frequently not be exploited since it can lead to faulty pulses and also to faulty findings and faulty counts.

Voltage peaks with which all industrial networks are more or less contaminated should also be named as a further source of disturbance. These voltage peaks, which originate from the switching of large inductivities, can lead to fault pulses which place restrictions on an increase in sensitivity.

The object of the invention is to provide an apparatus of the initially named kind which has, on the one hand, an extremely high response sensitivity for metal parts which move past it and which is, on the other hand, extremely secure against the occurence of fault pulses which could be caused by disturbances of the indicated kind.

In order to satisfy this object the invention provides that the sensor has at least two preferably decoupled sub-sensors which are arranged in series in such a way that a specific metal part to be detected causes the sub-sensors to respond one after the other; and in that the electronic sensing circuit then and only then transmits an output signal when the electronic control circuit has found the pulse sequence to be present which arises by sequential response of the sub-sensors. In this arrangement provision is preferably made that the electronic sensor circuit contains a logic circuit which responds to a predetermined pulse sequence and in particular to a predetermined number of pulses.

Thus, in accordance with the invention, only the pulses of the sub-sensors produced by the metal parts which move past them initiate an output pulse while the disturbing pulses which simultaneously arise at all the sub-sensors are supressed by the attached logic circuit. In accordance with the invention the response of the sub-sensors is thus consciously tolerated even in the case of disturbing pulses, but the exploitation of the pulses which arise in this way is supressed by a suitable logical circuit. The basic principle of the invention thus resides in an arrangement in which, through the special layout of the sensing arrangement, the signal which arises when a metal particle passes through the sensor arrangement is characterized by a code which can only arise through the passage of a metal particle. Furthermore, a logic circuit is provided for this signal evaluation which delivers an output signal when and only when a correspondingly coded signal appears at the input for the logic circuit. As fault pulses which can have their origins in mechanical jolts or electrical overvoltage peaks do not have this code such distrubances can also not lead to an output signal. The extremely increased sensitivity of the sensor arrangement can thus be fully exploited in practical industrial use.

In accordance with the invention several and at least two sensing planes are located in the sensing head so that when a metallic part passes through then it is not just one pulse which is generated, as was previously the case, but rather a pulse sequence. In order to avoid mutual interference of the sensing planes, short circuit rings of material which is of good electrical conductivity are provided between the windings, whereby the outwardly propagating HF fields can be short circuited. Moreover, the oscillating frequencies of the individual inductive sensing systems, i.e. of the sub-sensors, should be displaced relative to one another. In this way full decoupling of the various systems can be achieved.

The electronic sensor circuit is triggered both with spaced output pulses and also with overlapping output pulses of the generators one after the other so that a count signal is transmitted. If however the falling flank of a first pulse coincides with the rising flank of a second pulse, which is conceivable with a critical speed of the metal parts, then at least one of the two pulses is shortened in accordance with the invention (for example by differention) or extended (for example by means of a delay element) in such a way that the relevant flanks have a clear time separation.

Advantageous developments of the invention are characterized in the subordinate claims.

The invention will be described in the following by way of example and with reference to the drawing in which are shown:

FIG. 1 an illustration of principle of an apparatus in accordance with the invention for the detection and counting or metal parts, with the sensor arrangement being shown in a partially sectioned sideview and with for example three sensing planes being provided, FIG. 2 a block circuit diagram of a logic circuit connected to the sensor arrangement of the invention as a possible embodiment, it however being possible to build up the logic circuit in another suitable manner;

FIG. 3 another embodiment of a possible logic circuit, and

FIG. 4 several time pulse diagrams by which the operation of the logic circuits of FIGS. 2 and 3 are illustrated.

In accordance with FIG. 1 for example three flat ring-like coil windings 17, 17', 17" are arranged parallel to and spaced apart above one another and form three sensing planes I, II and III which are arranged above and parallel to one another. Metal parts indicated at 12 fall in intervals of time through the three inner spaces of the coil winding 17, 17', 17" from the top downwardly.

Short circuit rings 18, for example of copper, are provided between the coil windings 17, 17', 17" and also at the entry and exit and have the task of short circuiting those fields which propagate out of the individual sensing planes into the neighbouring sensing planes. To achieve a resonant circuit with a high Q factor the individual coil arrangements are provided with ferrite jackets 19.

Thus the individual coil windings 17, 17', 17" with ferrite jackets 19 and the short circuit rings 18 which mutually bound them form three decoupled sub-sensors 11, 11', 11" which are arranged above one another. The sensor arrangement 11, 11', 11" is arranged in a metallic housing 20 which has an entry opening 21 at the top and an outlet opening 22 at the bottom for the metal parts 12 or for the bulk material contaminated with metal parts. In this way almost every form of electrical influence is prevented from affecting the sensor arrangement 11, 11', 11" from the outside.

The individual coil windings 17, 17', 17" are components of oscillators 23, 23', 23" which in accordance with the invention have different frequencies in order to further complete the mutual decoupling of the sensing planes I, II and III. A separate oscillator 23, 23', 23" is provided for each sensing plane I, II and III.

The oscillators 23, 23', 23" are so constructed that, after appropriate amplification, a rectangular pulse arises at their outputs on passage of a metal particle 12 through the coil windings 17, 17', 17".

The outputs of all three oscillators 23, 23', 23" are connected to a logic circuit 14 which accordingly receives the rectangular pulses and which is so constructed that an output signal arises at the output 24 when and only when a pulse sequence with three (two) time sequential pulses arises at the input of the logic circuit 14 (FIG. 2) or 14' (FIG. 3) respectively, within a short time of each other. The entire electronic sensor circuit which consists of the individual HF-generators and the logic circuit is designated with the reference numeral 13.

A preferred embodiment of a logic circuit 14 is shown in FIG. 2 in which the same reference numerals designate components which correspond to those of FIG. 1. The three coil windings 17, 17', 17" of the three sensing planes I, II and III are connected again to the generators 23, 23', 23" and transmit pulses such as are shown in the first three diagrams in FIG. 4 when a metal particle 12 (FIG. 1) falls through them. The first diagram of FIG. 4 reproduces the rectangular pulse of the output of the oscillator 23, the second diagram the rectangular pulse of the output of the second oscillator 23' and the third diagram the rectangular pulse of the output of the third oscillator 23". Thus in total three time displaced rectangular pulses arise which can also overlap timewise.

The outputs of the oscillators 23, 23', 23" are connected to the inputs of an exclusive OR-gate 15 at the output of which a pulse sequence now arises such as is shown in the fourth diagram of FIG. 4. The exclusive OR-gate 15 however only transmits an output signal when a signal is present at only one of the inputs.

The pulse sequence which appears at the exclusive OR-gate 15 on the passage of a metal particle 12 in accordance with the forth diagram of FIG. 4 is passed to the input of a counter 16 which transmits a signal at its output 25 when three pulses have been counted. The output 24 of the logic circuit is thus energized by a single pulse 27 which shows that a metal particle 12 has passed through the sensor arrangement 11, 11', 11".

The falling flank 38 of the last pulse (FIG. 4) can activate the resetting input 41 of the counter 16 via an auxiliary circuit 29 (reversal stage) indicated in FIG. 2 and an OR-gate 30, whereby the counter 16 is reset after the appearance of three pulses as a result of the passage of a metal particle 12 and is this ready for the next counting procedure.

Thus, whereas the rectangular pulses generated by falling metallic particles 12 appear timewise one after the other a disturbing pulse appears simultaneously. This admittedly also results in pulses at the outputs of the generators 23, 23', 23". However, since these, appear simultaneously they are supressed by the exclusive OR-gate 15. Thus no pulse can arise at the output 24.

Should a small disturbing pulse influence only one sub-sensor, i.e. one pulses appear at an output of the generators 23, 23', 23", then this is not supressed by the exclusive OR-gate 15 and also sets the counter 16 to one but not however to three. An output pulse 27 thus also does not appear in this case.

In order however to reset the counter to zero in this special case of one disturbing pulse arising at one of the outputs of the generators 23, 23', 23" the outputs of the oscillators 23, 23', 23" are connected to the three inputs of a further OR-gate 32 which, via a delay stage 33 and a further OR-gate 30, initiates the resetting of the counter 16 after a time which is somewhat longer than the total time of the pulse sequence of the fourth diagram of FIG. 4. A short time after the occurence of a disturbing pulse the counter 16 is thus again ready for further counting.

As set forth a sensing system with three planes has been selected simply as an example to explain the principle of the invention. The number of sensing planes is arbitrary, however the hardness against disturbing pulses certainly increases with increase of the number of the sensing planes. The constructional height of one sensing plane can admittedly be kept very small from a design viewpoint, nevertheless limits often exist with respect to the possible constructional height or special technical tasks, so that one has to operate with the smallest possible number of sensing planes, namely two. In order to be able to exploit the advantages of the arrangement of the invention in this case as well as possible a further criteria can be asserted with the logic circuit 14. This is, in accordance with the invention, the direction of movement of the metal part 12 to be detected. For most tasks a metal particle can only pass the sensor arrangement in one specific direction. With a metallic separator for pourable bulk goods a metal particle to be detected can, for example, only pass through the sensor from the top to the bottom.

The circuit part 31 of FIG. 2 serves for example to include the directional movement of the metal part 12 to be detected into the signal evaluation. Here the output signal of the oscillator 23 is additionally passed to the input of the flipflop 26 which is so connected that the rising flank of the output signal of the oscillator 23 brings the output of the flipflop 26 to the L-signal (positive logic). An AND-gate 27 is connected after the flipflop 26 and the output signal of the oscillator 23" is passed to its second input. If the metal part 12 passes the arrangement from the top to the bottom then the output pulse of the oscillator 23" would arise at the output of the AND-gate 27 when the output of the oscillator 23 had previously transmitted a pulse. If one additionally connects a further AND-gate 28 to the counter 16 and to the AND-gate 27 then a pulse 34 will appear at the output 29 when and only when all three oscillators 23, 23', 23" (partly overlapping, which is not a condition and which however is also not disturbing) have transmitted pulses in sequence and additionally the three scanning planes I, II and III were passed in the named sequence. The resetting of the flipflop 26 takes place either by the rear or trailing flank of the pulse which originates from passage through the third sensing plane, i.e. via the auxiliary circuit 29 and the OR-gate 32, or however from one of the output pulses of the sensing planes I, II or III by means of the OR-gate 32, of the time circuit 33 (the function of which has already been described) and of the OR-gate 30.

The circuit parts 32 and 33 and thus also the OR-circuit 30 are also advantageous for a further reason: Irrespective of how high one attempts to set the response sensitivity of the sub-sensors there will always be a limiting region in which when a very small metal particle passes through the sensor an output pulse only just arises at the output of one sub-sensor but an output pulse does not quite arise at the output of another part sensor. In this case it will be possible that the counter 16 and, if present, the flipflop 26 would not be reset in the absence of the circuit parts 32, 33 and 30. With round inductive probes in particular the sensing sensitivity is strongly location dependent. At the center the sensitivity is for physical reasons the lowest and increases rapidly towards the wall. As a metal particle can also pass obliquely through the sensing arrangement this case can never be precluded. On falling short of the level of sensitivity of a sensing plane the respective particle will consciously not be registered, the operation of the overall arrangement is however ensured.

If the number of sensing planes is small then the required logic function can also be realized with a few flipflops which is shown in FIG. 3 as a further possible embodiment of the arrangement of the invention. The logic circuit is designated with 14'. An arrangement was selected which has only two sensing planes in which the same reference numerals are used to designate corresponding components or component groups as in FIG. 1 and 2. The two coil windings 17 and 17' of the two sensing planes I and II are again connected to the generators 23 and 23' which transmit pulses when a metal particle 12 (FIG. 1) falls through as are shown in the first two diagrams in FIG. 4. The first diagram reproduces the rectangular pulse at the output of the oscillator 23 and the second diagram reproduces the rectangular pulse of the output of the second oscillator 23'. Thus, in this arrangement, a total of two time displaced rectangular pulses arise which can also overlap.

The outputs of the oscillators 23 and 23' are connected to the inputs of the exclusive OR-gate 15 at the output of which a pulse sequence of two pulses now appears on passage of a metal part. The output of the exclusive OR-gate 15 is connected with an auxiliary circuit 34 (inversional stage) and the input of an AND-gate 36. The output of the auxiliary circuit 34 controls a flipflop 35. Through this arrangement it is ensured that the rear or trailing flank of the first output pulse of the exclusive OR-gate 15 so controls the flipflop 35 that a low signal appears at its output and at the first input of the AND-gate 36. If now the second pulse appears at the output of the exclusive OR-gate 15 then it also appears at the second input of the AND-gate 36 and a pulse 27 appears at the output 24.

The resetting of the flipflop 35 takes place either through the rear flank of the output signal of the oscillator 23', which is achieved by the circuit parts 29 and 30 or by one of the two output pulses of the oscillators 23 or 23', and indeed by means of the circuit parts 32, 33 and 30 in the same manner as was recited in the functional description of the circuit of FIG. 2. The logic circuit 14' (FIG. 3) can also be made directionally dependent by a circuit part 31. As already described an output pulse 30 would appear at the output 29 of the AND-gate 28 when and only when both pulses arise in the correct sequence, i.e. the metal part to be detected first triggers a signal in the sensing plane I and then timewise thereafter initiates a further signal in the sensing plane II.

The aperture of the inductive probes need not be round, on the contrary it is advantageous to make the opening slotlike, as is explained in DE-PS 29 44 192. The method is also not restricted to inductively acting sensors but can rather also be used in accordance with the invention with sensors which have different physical operating mechanisms, when high sensitivity is disturbing and pulses of the described kind need to be supressed.

An evaluation of the analog signals also appears conceivable in which the described conditions are satisfied in a suitable manner.

The circuits given in FIGS. 2 and 3 simply serve as examples for the signal evaluation of a sensor in accordance with the invention. The task, in particular the logic circuit, can also for example be realized by means of a shift register or by other suitable groups of components which however changes nothing in the evaluation principle. The selected code can also be enlarged, for example narrow and broad sensing ranges can be combined and the logic circuit can be correspondingly constructed. The hardness of the arrangement against disturbing pulses can be further increased in this way.

In order to generate a pulse sequence a sensor arrangement with an oscillator can also be used in accordance with the invention if the resonant circuit coil is subdivided into several partial coils. The construction will then correspond again to FIG. 1, however all partial coils are only connected with one oscillator which only oscillates at one frequency. As in this case, in contrast to an assembly with an exclusive OR-gate, no separation of overlapping pulses is possible attention should be paid to the fact that the metal part has reliably left the operating range of one scanning plane before it enters into the operating range of the subsequent scanning plane. In this respect the time constants, in particular with regulated oscillators, and also the speed of the metal part have a role to play in addition to the size of the metal part itself and the spacing of the sensing planes from one another. The sub-sensors can also be accomodated in separate housings; this offers the advantage that the spacing of the sensors relative to one another can also be changed at a later stage.

A preferred security against disturbing pulses is already achieved if one operates with only two sub-sensors or sensing planes, so that in accordance with the invention an embodiment with only two but at most three sub-sensors or sensing planes is particularly advantageous.

I claim:

1. An apparatus for detecting and counting metal objects which comprises
   a sensor, comprising a plurality of
      sub-sensors, each connected to sense the motion of a metal object in proximity thereto, said sub-sensors being disposed so that the metal object to be detected passes said sub-sensors seriatim;
   an electronic sensing circuit, comprising
      a plurality of pulse generators, one for each sub-sensor, each said generator coupled to one said sub-sensors to generate a pulse in response to a metal object passing near said sub-sensor, each said generator containing
         an oscillator coupled to said sub-sensor, connected to change frequency in response to a metal object passing near said sub-sensor;
      a logic circuit, comprising
         an exclusive OR-gate, having a plurality of inputs and an output, each of said inputs being coupled to one of said pulse generators; and
         a counter, coupled to the output of said exclusive OR-gate, which transmits a detection signal after counting a predetermined number of pulses.

2. An apparatus for detecting and counting metal objects which comprises,
   a sensor, comprising a plurality of
      sub-sensors, each sub-sensor comprising a flat, ring-like coil winding having an axis perpendicular to the plane of said coil winding and an opening in the center of said coil winding, said sub-sensors connected to respond to the motion of a metal object through said opening, and said sub-sensors being disposed substantially coaxially; and
      a plurality of short circuit rings, composed of electrically conductive material, one said short circuit ring disposed between each adjacent pair of ring like coil windings and substantially coaxial therewith; and
   an electronic sensing circuit coupled to said sub-sensors, said sensing circuit connected to transmit an output signal when, and only when, said sub-sensors respond in a predetermined sequence.

3. An apparatus for detecting and counting metal objects which comprises,
   a sensor, comprising a plurality of
      sub-sensors, each sub-sensor comprising a flat, ring-like coil winding having an axis perpendicular to the plane of said coil winding and an opening in the center of said coil winding, said sub-sensors connected to respond to the motion of a metal object through said opening, and said sub-sensors being disposed substantially coaxially;
   an electronic sensing circuit, coupled to said sub-sensors, said sensing circuit connected to transmit an output signal when, and only when, all of the sub-sensors respond seriatim; and
   direction sensing means to selectively respond to one or more predetermined sequences of sub-sensor responses.

4. An apparatus for detecting and counting metal objects which comprises,
   a sensor, comprising a plurality of
      sub-sensors, each adapted to respond to the motion of a metal object in proximity thereto;
   an electronic sensing circuit, comprising
      a plurality of pulse generators, one for each sub-sensor, connected to produce a pulse when said sub-sensor responds to the motion of said metal object; and
      a logic circuit, comprising
         an exclusive OR-gate, having a plurality of inputs and an output, with each of said inputs coupled to one of said pulse generators; and
         a counter, having a data input, coupled to the output of said exclusive OR-gate, and a reset input, said counter connected to transmit a detect signal after counting a predetermined number of pulses;
         a further OR-gate, having a plurality of inputs, each input coupled to a different generator, and an output
         a delay stage, having an input coupled to said further OR-gate and an output;
         an inverting stage, having an input coupled to the output of said first generator and an output; and
         a third OR-gate, having a first input coupled to the output of said inverting stage, a second input coupled to the output of said delay stage, and an output coupled to the reset input of said counter.

5. An apparatus for detecting and counting metal objects which comprises,
   a sensor, comprising a plurality of
      sub-sensors, each connected to respond to the motion of a metal object in proximity thereto;
      a plurality of pulse generators, coupled to said sub-sensors and connected to generate a pulse when said sub-sensors detects the motion of a metal object; and
      a logic circuit, comprising
         an exclusive OR-gate, having a plurality of inputs and an output, with each of said inputs coupled to one of said pulse generators;
         an AND-gate, having a first input, a second input, and an output, said first input being coupled to the output of said exclusive OR-gate;
         a reversing stage, having an input coupled to the output of said AND-gate and an output; and
         a flip flop, having an input coupled to the output of said reversing stage and having an output coupled to the said second input of said AND-gate.

* * * * *